(12) United States Patent
Abesingha et al.

(10) Patent No.: US 11,742,848 B1
(45) Date of Patent: Aug. 29, 2023

(54) HIGH-VOLTAGE TRANSMISSION GATE ARCHITECTURE

(71) Applicant: pSemi Corporation, San Diego, CA (US)

(72) Inventors: Buddhika Abesingha, Escondido, CA (US); Gregory Szczeszynski, Hollis, NH (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/673,372

(22) Filed: Feb. 16, 2022

(51) Int. Cl.
*H03K 17/567* (2006.01)
*H03K 17/00* (2006.01)

(52) U.S. Cl.
CPC ......... *H03K 17/567* (2013.01); *H03K 17/005* (2013.01)

(58) Field of Classification Search
CPC ........................... H03K 17/567; H03K 17/005
See application file for complete search history.

(56) References Cited

U.S. PATENT DOCUMENTS 6,509,781 B2 * 1/2003 Dufort ................ H03K 17/063
327/437
2017/0310320 A1 * 10/2017 Bottarel .................. H03K 5/08

\* cited by examiner

*Primary Examiner* — Metasebia T Retebo
(74) *Attorney, Agent, or Firm* — Steinfl + Bruno LLP (57) ABSTRACT

Circuits and methods for transmitting high-voltage (HV) static and/or switching signals via a high-voltage (HV) transmission gate controllable via low-voltage (LV) logic are presented. The HV gate includes a biasing circuit for generating a biasing voltage to gates of two series-connected HV transistors. According to one aspect, the biasing voltage is generated through a pull-up device coupled to a HV supply having a voltage level higher than a high voltage of a signal to be transmitted. According to another aspect, the biasing voltage is generated through a LV supply coupled to a diode, and a capacitor coupled between the gates and the sources of the HV transistors. When the gate is activated, the combination of the LV supply coupled to the diode and the capacitor generates a biasing voltage based on a sum of a voltage of the LV supply and an instantaneous voltage level of the signal being transmitted.

18 Claims, 11 Drawing Sheets

HIGH-VOLTAGE TRANSMISSION GATE ARCHITECTURE

TECHNICAL FIELD

The present disclosure is related to electronic power circuits and systems, and more particularly to circuits and methods to transmit high-voltage signals from such electronic power circuits and systems.

BACKGROUND

Figure 1A:
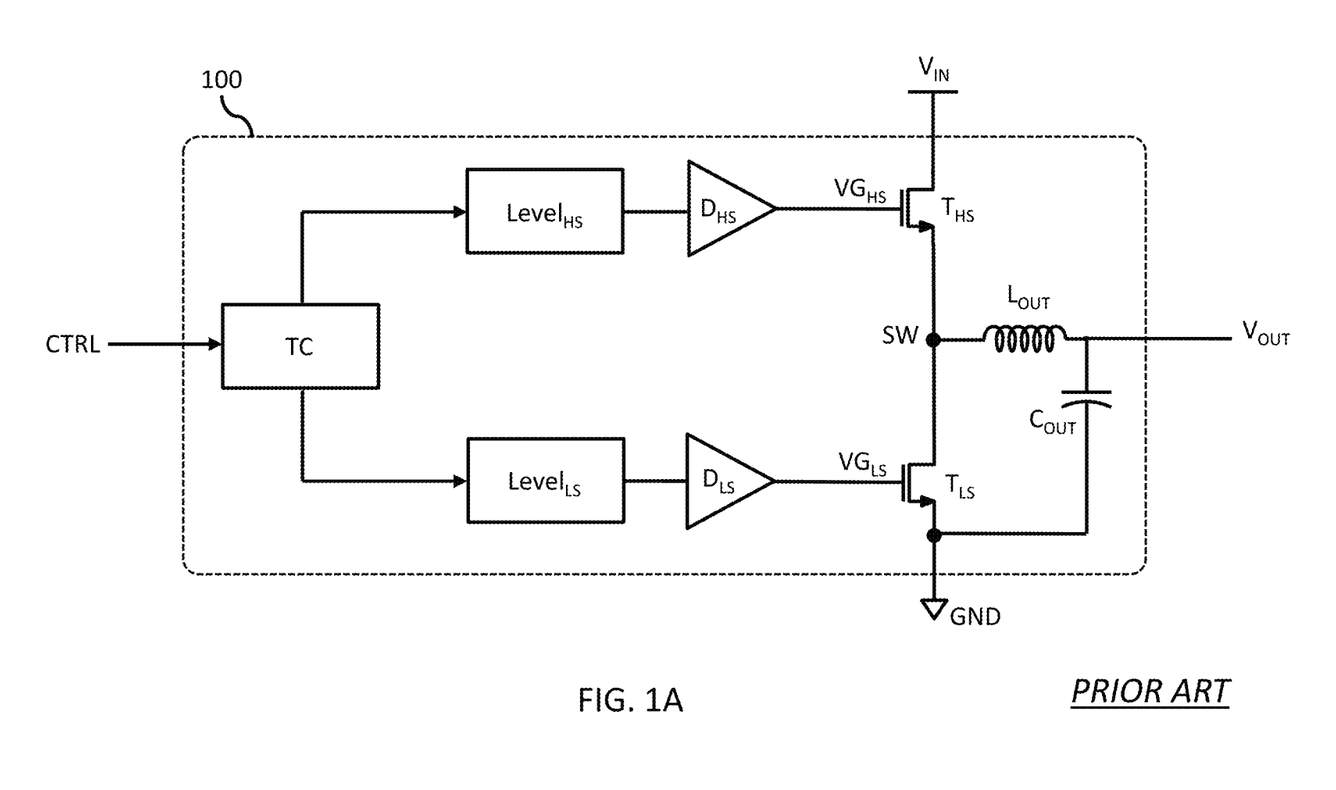
FIG. 1A shows a simplified block diagram of a prior art power converter circuit.

FIG. 1A shows a simplified block diagram of a (prior art) power converter circuit (100, e.g., buck converter) that may be used to convert a high-voltage, $V_{IN}$, to (a lower) output voltage, $V_{OUT}$, through a switching circuit comprising transistors ($T_{HS}$, $T_{LS}$). Operation of the switching circuit, including gate drive voltages ($VG_{HS}$, $VG_{LS}$) for ON/OFF control of the transistors ($T_{HS}$, $T_{LS}$) may be provided by a timing control circuit block, TC, that may generate, from an input control signal, CTRL, timing information to respective high-side (HS) and low-side (LS) level shifters (Level$_{HS}$, Level$_{LS}$) for provision to respective HS and LS drivers ($D_{HS}$, $D_{LS}$). As shown in FIG. 1A, the transistor, $T_{HS}$, and the transistor, $T_{LS}$, are arranged in series-connection between the high-voltage, $V_{IN}$, and a reference ground, GND, wherein a common/switching node, SW, provides a coupling between the two transistors. Alternate ON (or OFF) switching of the transistors ($T_{HS}$, $T_{LS}$) may cause a switching voltage at the node, SW, that may switch to a level substantially equal (e.g., within a drain-to-source voltage drop of $T_{HS}$) to the high-voltage, $V_{IN}$, when the high-side transistor, $T_{HS}$, is ON, and to a level substantially equal (e.g., within a drain-to-source voltage drop of $T_{LS}$) to the reference ground, GND, when the low-side transistor, $T_{LS}$, is ON. An inductor, $L_{OUT}$, coupled to the switching node, SW, may provide a (continuous) current conduction path for a load current to a load that may include a capacitor, $C_{OUT}$, for output of the (DC) voltage $V_{OUT}$.

As known to a person skilled in the art, a power circuit such as the power converter circuit (100) of FIG. 1A may operate based on high-voltage signals that may reach voltage levels in a range from 6 volts to 100 volts or higher. Furthermore, such high-voltage signals may be switching signals that switch between a high-voltage level and a low-voltage level that is substantially lower than the high-voltage level (e.g., in a range from 0 volts to less than 6 volts) or may be static signals that have a fixed (high-) voltage level. Accordingly, monitoring of such signals may require a circuit that can handle (e.g., transmit, conduct, etc.) low-voltage and high-voltage levels for static and switching signals. Furthermore, it may be desirable that such circuit may be capable of monitoring a plurality of such signals while reducing number of monitoring paths and therefore of corresponding (output) pins (e.g., in a case of module or chip). Furthermore, it may be desirable that selection of a signal to be monitored through such circuit may be provided through low-voltage control signals to the circuit and without any level translation or shifting.

Teachings according to the present disclosure provide circuits and methods for transmitting one or more high-voltage signals from a power circuit or system through a common output path, selection of a high-voltage signal for transmission being provided through a low-voltage control signal.

SUMMARY

According to a first aspect of the present disclosure, a high-voltage (HV) transmission gate is presented, the HV transmission gate comprising: first and second HV transistors in coupled between a first terminal and a second terminal, gates of the first and second HV transistors connected at a common biasing node and sources of the first and second HV transistors connected at a common source node; a capacitor connected between the common biasing node and the common source node; and a biasing circuit coupled to the common biasing node, the biasing circuit comprising: a diode having an anode that is selectively coupled to a low-voltage (LV) supply and a cathode connected to the common biasing node, wherein: the HV transmission gate comprises an activated state during which the first and second HV transistors are ON, and a deactivated state during which the first and second HV transistors are OFF, in the activated state, the anode of the diode is coupled to the LV supply, and in the deactivated state, the anode of the diode is decoupled from the LV supply.

According to a second aspect of the present disclosure, a high-voltage (HV) transmission gate is presented, the HV transmission gate comprising: first and second HV transistors in series-connection between a first terminal and a second terminal, gates of the first and second HV transistors connected at a common biasing node and sources of the first and second HV transistors connected at a common source node; and a biasing circuit coupled to the common biasing node, the biasing circuit comprising: a third HV transistor comprising a source connected to a reference ground, and a drain connected to the common biasing node; and a pull-up device coupled between the common biasing node and a high-voltage (HV) supply, wherein: the HV transmission gate comprises an activated state during which the first and second HV transistors are ON, and a deactivated state during which the first and second HV transistors are OFF, in the activated state, the third HV transistor is OFF, no current flows from the pull-up device through the third HV transistor, and the common biasing node is at about a voltage level of the HV supply, and in the deactivated state, the third HV transistor is ON a current flows from the pull-up device through the third HV transistor, and the common biasing node is at about zero volts.

According to a third aspect of the present disclosure, a method for transmitting a high-voltage (HV) signal between two terminals is presented, the method comprising: coupling first and second HV transistors in series-connection between a first terminal and a second terminal, connecting gates of the first and second HV transistors at a common biasing node and sources of the first and second HV transistors at a common source node; connecting a capacitor between the common biasing node and the common source node; connecting a cathode of a diode to the common biasing node; for transmitting of the HV signal from the first terminal to the second terminal, coupling a low-voltage (LV) supply to an anode of the diode, thereby turning ON the first and second HV transistors; and for isolating the first terminal from the second terminal, decoupling the LV supply from the anode of the diode and coupling a voltage that has a level of about zero volts to the cathode of the diode, thereby turning OFF the first and second HV transistors.

Further aspects of the disclosure are provided in the description, drawings and claims of the present application.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Figure 1B:
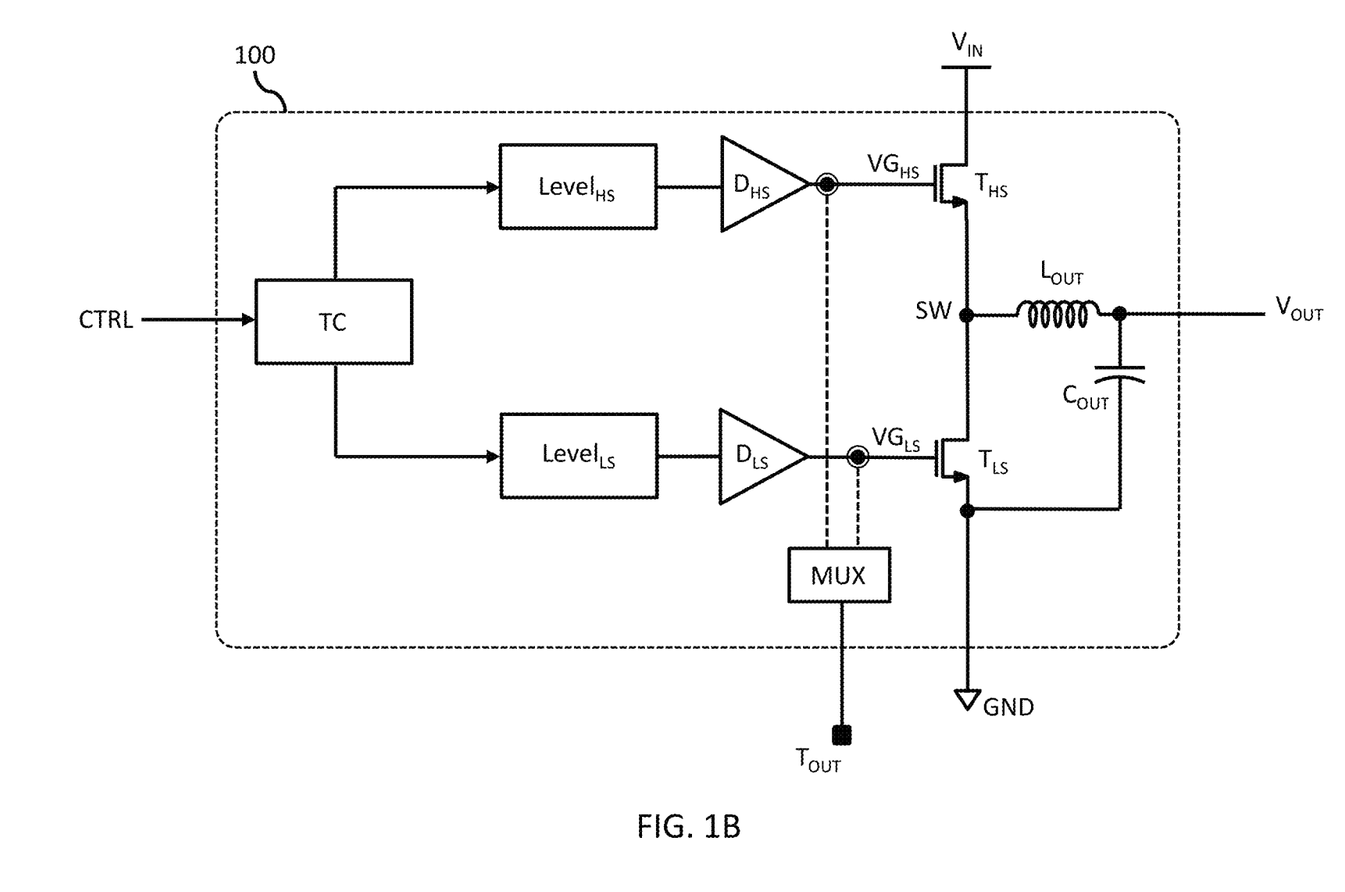
FIG. 1B shows the block diagram of FIG. 1A modified to include a multiplexing circuit for transmitting one of a plurality of signals from the power converter circuit.

Teachings according to the present disclosure may be used to implement a multiplexing circuit, MUX, as shown in FIG. 1B. The multiplexing circuit, MUX of FIG. 1B may be used for transmitting one of a plurality of signals (e.g., $VG_{HS}$, $VG_{LS}$) from a power circuit, such as the power converter circuit (100). Such signals may be static or switching signals having low-voltage and/or high-voltage levels. As used herein, a high-voltage (HV), or a high-voltage (HV) level, may refer to a voltage or voltage level that is in a range from 6 volts to 100 volts or higher, whereas a low-voltage (LV), or a low-voltage (LV) level, may refer to a voltage or voltage level that is in a range from 0 volts to a voltage lower than 6 volts. As used herein, a high-voltage (HV) device may refer to a device (e.g., transistor) that can withstand a high-voltage across any two terminals of the device while providing a safe operating margin of the device. As used herein, a low-voltage (LV) device may refer to a device (e.g., transistor) that can withstand a low-voltage across any two terminals of the device while providing a safe operating margin of the device. Accordingly, a HV device may be (safely) coupled to a HV signal having a HV voltage, whereas a LV device may be (safely) coupled only to a LV signal having a LV voltage.

With continued reference to FIG. 1B, the multiplexer circuit, MUX, selectively outputs/transmits one of a plurality of signals (e.g., $VG_{HS}$, $VG_{LS}$) to a common output terminal/node, $T_{OUT}$. In other words, a selected signal from the plurality of signals (e.g., $VG_{HS}$, $VG_{LS}$) may be conducted through a common conduction path that is coupled to the common output terminal, $T_{OUT}$, while the other (unselected) signals are isolated (e.g., decoupled) from the common conduction path and the common output terminal, $T_{OUT}$. Such configuration using a single conduction path/output terminal may allow a reduction in number of pins used in an integrated circuit (IC) implementing the functionality of the configuration shown in FIG. 1B.

Figure 2:
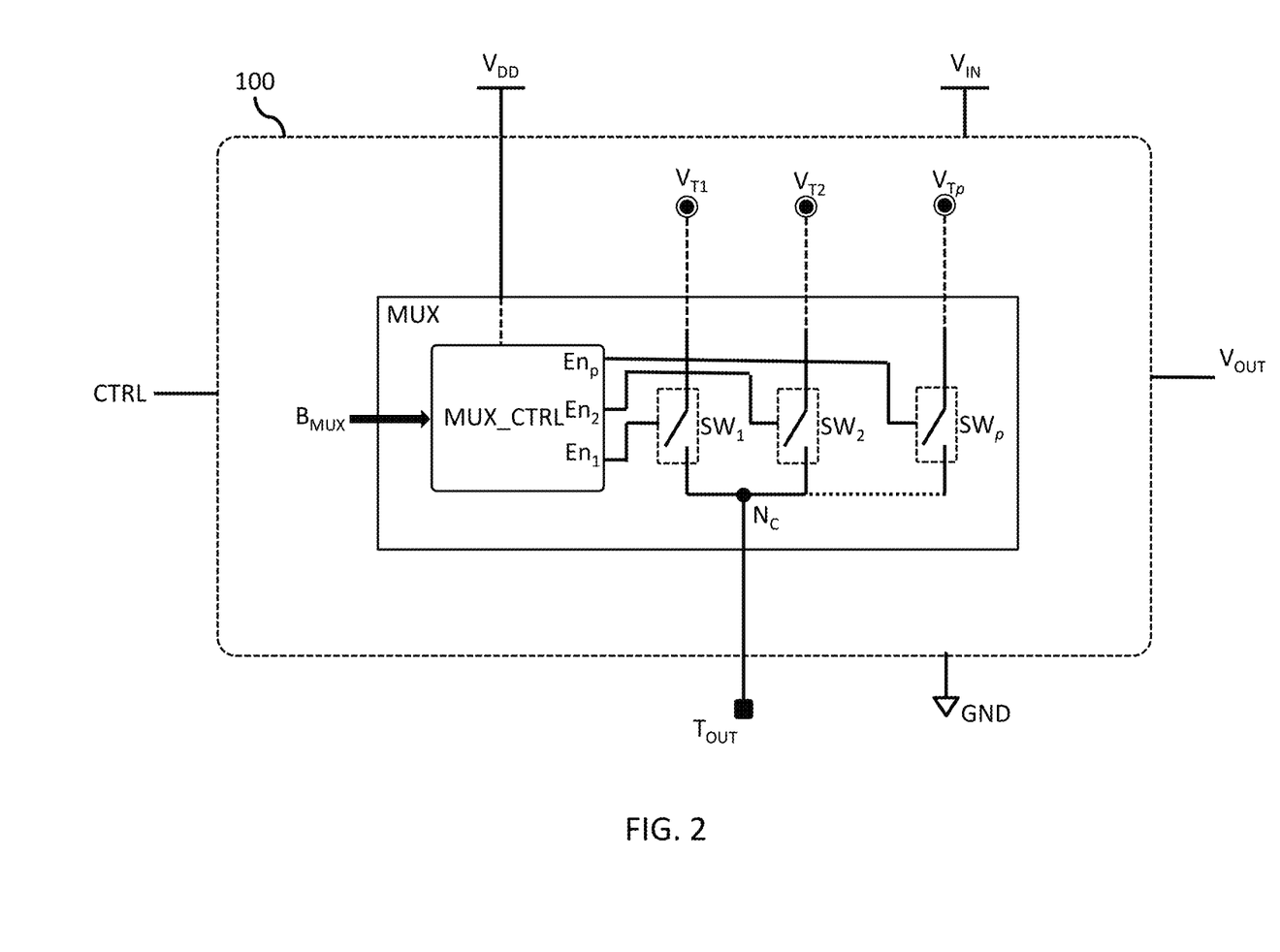
FIG. 2 shows a simplified block diagram of a multiplexing circuit according to an embodiment of the present disclosure that may be used in the configuration of FIG. 1B.

FIG. 2 shows a simplified block diagram of a multiplexing circuit, MUX, according to an embodiment of the present disclosure that may be used in the configuration of FIG. 1B. As shown in FIG. 2, the multiplexing circuit, MUX, may include a control block, MUX_CTRL, coupled to a plurality of switching elements (e.g., $SW_1$, $SW_2$, . . . , $SW_p$) for selective output of one of a plurality of signals (e.g., $V_{T1}$, $V_{T2}$, . . . , $V_{Tp}$) to the common output terminal, $T_{OUT}$. As shown in FIG. 2, each of the switching elements (e.g., $SW_1$, $SW_2$, . . . , $SW_p$) may include a first terminal that may be coupled to a respective one of the plurality of signals (e.g., $V_{T1}$, $V_{T2}$, . . . , $V_{Tp}$), and a second terminal that may be coupled to the common output terminal, $T_{OUT}$. As shown symbolically in FIG. 2, functionality of each of the switching elements (e.g., $SW_1$, $SW_2$, . . . , $SW_p$) may be likened to a single-pole single-throw (SPST) switch that may be capable of withstanding high-voltage levels provided by one or more of the plurality of signals (e.g., $V_{T1}$, $V_{T2}$, . . . , $V_{Tp}$) while isolating such high-voltage levels from the control block, MUX_CTRL.

As shown in FIG. 2, the control block, MUX_CTRL, may operate from a low-voltage supply, $V_{DD}$, and therefore implementable via standard low-voltage logic gates (and without need for level translation/shifting or use of high-voltage devices/transistors). The MUX_CTRL may receive a control word $B_{MUX}$ which may be a digital word that indicates which one of the plurality of signals (e.g., $V_{T1}$, $V_{T2}$, . . . , $V_{Tp}$) to be selected. The MUX_CTRL decodes $B_{MUX}$ to select the switch element that will transmit the input signal requested $B_{MUX}$. It should be noted that arrangement of the control block, MUX_CTRL, may not necessarily be confined within the power circuit (e.g., 100) as shown in FIG. 2, rather it may be arranged within or outside the boundaries of the power circuit based on design goals and/or requirements/limitations. Such flexibility in arrangement of the control bock, MUX_CTRL, relative to the power circuit (e.g., 100), and therefore to the switching elements (e.g., $SW_1$, $SW_2$, . . . , $SW_p$) that may be contained within the power circuit, may be provided via operability of the control block, MUX_CTRL, from a low-voltage supply (e.g., $V_{DD}$), and the isolation provided by the switching elements (e.g., $SW_1$, $SW_2$, . . . , $SW_p$) with respect to the high-voltage levels of the signals coupled to such switching elements.

Figure 3A:
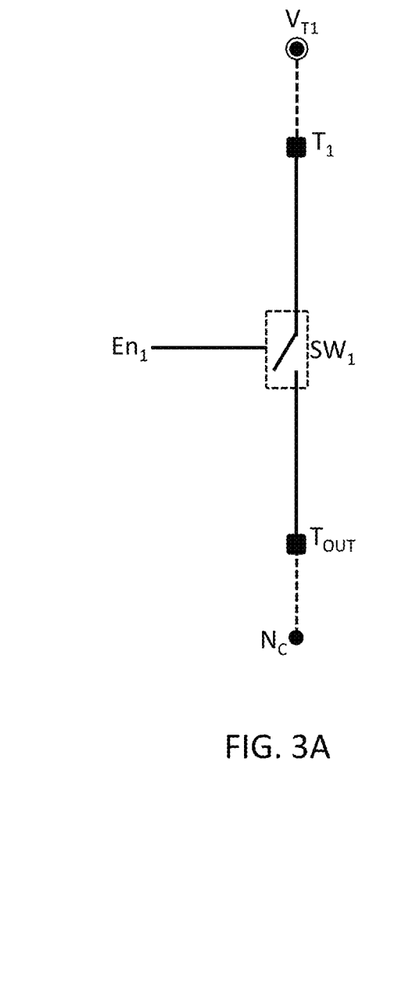
FIG. 3A shows a simplified block diagram of a HV transmission gate according to an embodiment of the present disclosure.

As shown in FIG. 3A, each of the switching elements (e.g., $SW_1$, $SW_2$, . . . , $SW_p$) according to the present disclosure may be considered as an independent element. Such independent element (e.g., $SW_1$ of FIG. 3A) may be referred to as a high-voltage (HV) transmission gate since it may "transmit", or in other words conduct, output, couple, etc., a HV signal (e.g., $V_{T1}$ of FIG. 3A) at a first terminal, $T_1$, of the HV transmission gate (e.g., $SW_1$ of FIG. 3A) to a second terminal, $T_{OUT}$, when the HV transmission gate (e.g., $SW_1$ of FIG. 3A) is enabled/activated, and isolate (e.g., decouples) the HV signal at the first terminal, $T_1$, from the second terminal, $T_{OUT}$, when the HV transmission gate (e.g., $SW_1$ of FIG. 3A) is disabled/deactivated. Activation and deactivation of the HV transmission gate (e.g., $SW_1$ of FIG.

3A) is being provided via a low-voltage control signal output by the MUX_CTRL in FIG. 2. It should be noted that as described above, the HV transmission gate (e.g., $SW_1$ of FIG. 3A) according to the present disclosure may transmit HV and/or LV signals, whether switching signals or static signals. It should further be noted that the HV transmission gate (e.g., $SW_1$ of FIG. 3A) according to the present disclosure may operate bidirectionally and not necessarily from the first terminal, $T_1$, to the second terminal, $T_{OUT}$.

Figure 3B:
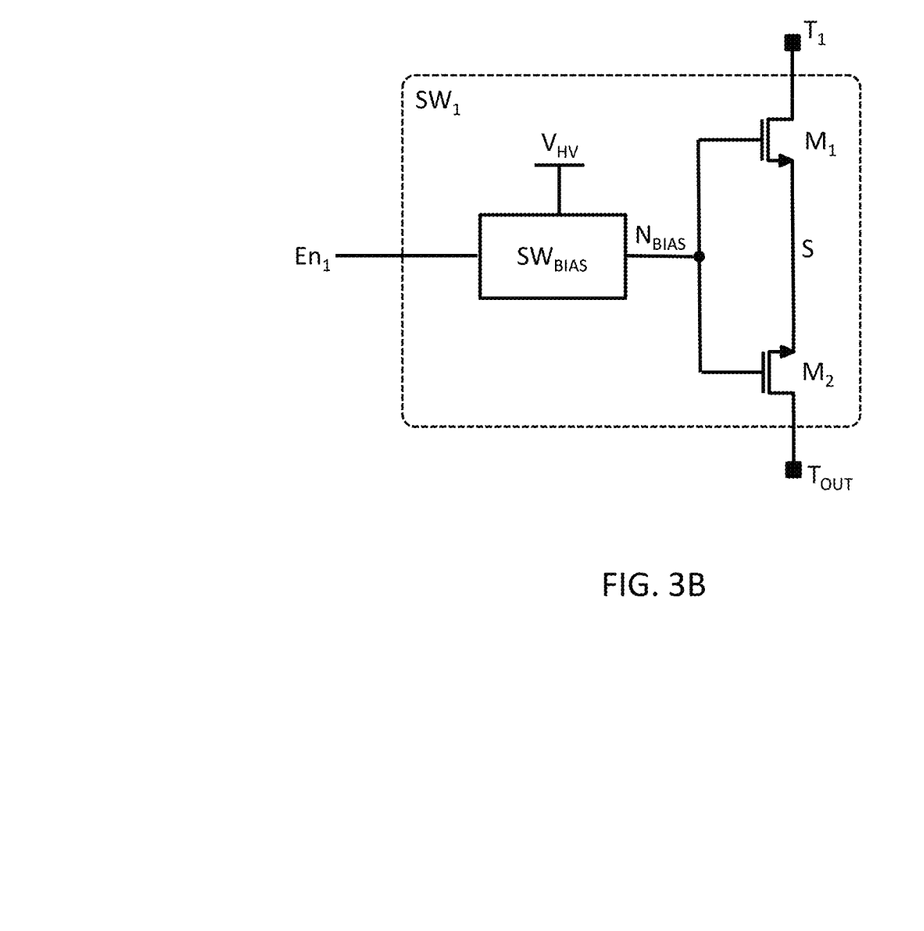
FIG. 3B shows further details of the HV transmission gate of FIG. 3A according to an embodiment of the present disclosure.

FIG. 3B shows further details of the HV transmission gate, $SW_1$, of FIG. 3A according to an embodiment of the present disclosure. As shown in FIG. 3B, the HV transmission gate, $SW_1$, may include series-connected first and second transistors, $M_1$ and $M_2$, coupled (e.g., directly coupled, connected) between the first terminal, $T_1$, and the second terminal, $T_{OUT}$. According to an embodiment of the present disclosure, the transistors $M_1$ and $M_2$ may be high-voltage N-type FET transistors having respective sources coupled to one another at a common source node, S, to provide the series-connection. Furthermore, a drain of the first transistor, $M_1$, may be coupled to the first terminal, $T_1$, and a drain of the second transistor, $M_2$, may be coupled to the second terminal, $T_{OUT}$. Gates of the transistors $M_1$ and $M_2$ may be coupled at a common biasing node, $N_{BIAS}$, to a biasing circuit, $SW_{BIAS}$, for provision of a common biasing voltage (e.g., voltage at $N_{BIAS}$) to the transistors $M_1$ and $M_2$.

With continued reference to FIG. 3B, the common biasing voltage provided at the common biasing node, VBIAS, may control ON and OFF states of the transistors $M_1$ and $M_2$, and therefore the ON (activated) and OFF (deactivated) states of the HV transmission gate, $SW_1$. When both transistors $M_1$ and $M_2$ are ON (activated, conduct), a signal at the first terminal, $T_1$, is transmitted/conducted to the second terminal, $T_{OUT}$, and when both transistors $M_1$ and $M_2$ are OFF (deactivated, do not conduct), a signal at the first terminal, $T_1$, is isolated from a signal at the second terminal, $T_{OUT}$. In other words, in the activated state of the HV transmission gate, $SW_1$, the transistors $M_1$ and $M_2$ are ON and a low impedance conduction path is established between the first terminal $T_1$, and the second terminal $T_{OUT}$, and in the deactivated state of the HV transmission gate, $SW_1$, the transistors $M_1$ and $M_2$ are OFF and a high impedance path is established between the first terminal $T_1$, and the second terminal $T_{OUT}$, such high impedance path isolating the first terminal, $T_1$, from the second terminal $T_{OUT}$. It should be noted that by virtue of using two series-connected transistors (e.g., $M_1$ and $M_2$), an increase in isolation performance between the first and second terminals, $T_1$ and $T_{OUT}$, may be provided by the HV transmission gate, $SW_1$, according to the present disclosure.

Figure 3C:
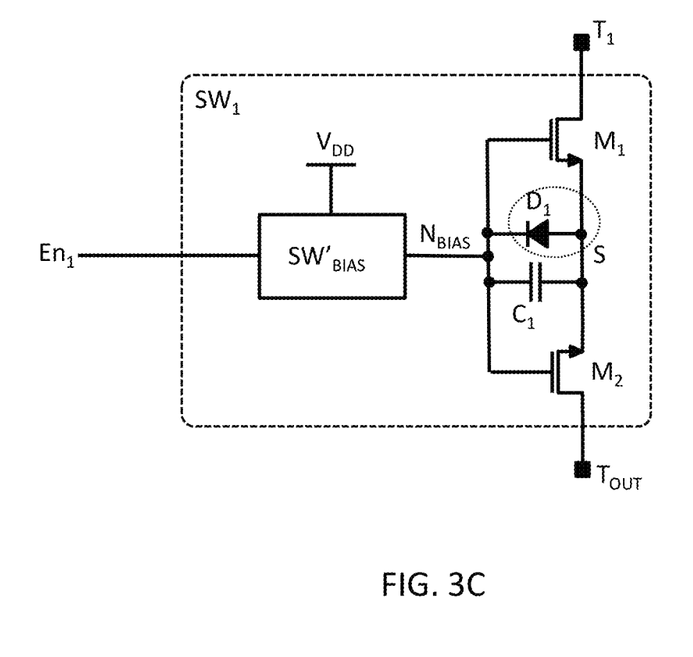
FIG. 3C shows further details of the HV transmission gate of FIG. 3A according to another embodiment of the present disclosure.

With further reference to FIG. 3B, a voltage level of a signal to be transmitted from the first terminal, $T_1$, to the second terminal, $T_{OUT}$, may have a high-voltage level that during activation of the HV transmission gate, $SW_1$, may couple to the sources of the transistors $M_1$ and $M_2$, therefore ON states of such transistors may require a level of the common biasing voltage (at node $N_{BIAS}$) that is sufficiently above the high-voltage level of the signal being transmitted (e.g., by at least a threshold voltage of the transistors $M_1$ and $M_2$ or more). Teachings according to the present disclosure allow provision of such level of the common biasing voltage either through a high-voltage supply (e.g., $V_{HV}$ of FIG. 3B) or through an adaptive generation of such level based on a combination of a low-voltage supply (e.g., $V_{DD}$ of FIG. 3C) and the (instantaneous) voltage level of the signal to be transmitted. Accordingly, respective biasing circuits, $SW_{BIAS}$ and $SW'_{BIAS}$, of the HV transmission gate, $SW_1$, whose details are shown in FIG. 3B and FIG. 3C depending on the respective biasing circuits $SW_{BIAS}$ and $SW'_{BIAS}$, may be configured to respectively operate from either a high supply voltage, $V_{HV}$, or a low supply voltage, $V_{DD}$. Exemplary circuit implementations of the biasing circuits, $SW_{BIAS}$ and $SW'_{BIAS}$, are later described with respective reference to FIG. 4 and FIGS. 5A-5D.

With continued reference to FIG. 3B and FIG. 3C, the respective biasing circuits, $SW_{BIAS}$ and $SW'_{BIAS}$, of the HV transmission gate, $SW_1$, may set, via a control signal, $E_{n1}$, output by the control block, MUX_CTRL, of FIG. 2, the common biasing voltage at the common biasing node, $N_{BIAS}$, to: a low-voltage value that is equal to about zero volts so that a gate-to-source voltage of each of the transistors $M_1$ and $M_2$ is substantially below the respective threshold voltage, thereby deactivating the HV transmission gate, $SW_1$; and a high-voltage value that is equal to, or above, a sum of the respective threshold voltage and a voltage level of a signal at the first terminal, $T_1$, of the HV transmission gate, $SW_1$, thereby activating the HV transmission gate, $SW_1$.

In a case of the configuration shown in FIG. 3B, the common biasing voltage at the common biasing node, $N_{BIAS}$, may be generated by the biasing circuit, $SW_{BIAS}$, based on the high supply voltage, $V_{HV}$, that has a voltage level that is sufficiently above the high-voltage level of the signal being transmitted (e.g., by at least a threshold voltage of the transistors $M_1$ and $M_2$ or more). On the other hand, in case of the configuration of FIG. 3C, the common biasing voltage at the common biasing node, $N_{BIAS}$, may be generated by the biasing circuit, $SW'_{BIAS}$, based on a combination of the low-voltage supply, $V_{DD}$, and the (instantaneous) voltage level of the signal being transmitted. As shown in FIG. 3C, according to an exemplary embodiment of the present disclosure, such combination may be provided via a capacitor, $C_1$, coupled between the common source node, S, and the common biasing node, $N_{BIAS}$, that is configured to couple a voltage (of a signal being transmitted/present) at the common source node, S, to a low-voltage generated by the biasing circuit, $SW'_{BIAS}$. In other words, the capacitor, $C_1$, may allow bootstrapping of the low-voltage generated by the biasing circuit, $SW'_{BIAS}$, at the common biasing node, $N_{BIAS}$, to the voltage of the signal being transmitted (i.e., at the first terminal, $T_1$). Furthermore, as shown in FIG. 3C, a diode, $D_1$, may be optionally (dotted circle indicating optionality) coupled between the common source node, S, and the common biasing node, $N_{BIAS}$, such as to allow clamping of a voltage level at the common source node, S, from rising too far above a voltage level at the common biasing node, $N_{BIAS}$, thereby keeping the gate-to-source voltages of the transistors $M_1$ and $M_2$ within compliance limits, even during transitions times corresponding to switching voltage levels of the signal being transmitted. It should be noted that as it is well-known to a person skilled in the art, the diode, $D_1$, may be implemented via a diode-connected transistor (e.g., N-type FET).

Figure 4:
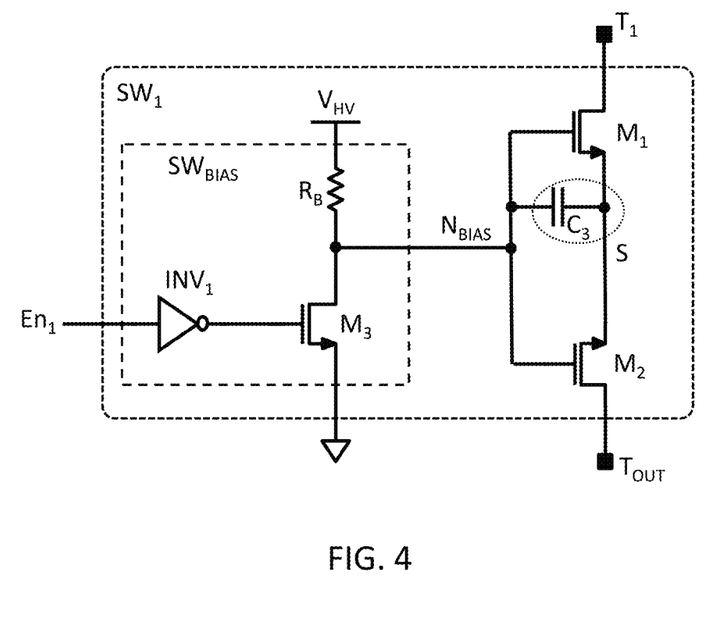
FIG. 4 shows a simplified schematic of the HV transmission gate of FIG. 3B according to an embodiment of the present disclosure.

FIG. 4 shows a simplified schematic of the HV transmission gate, $SW_1$, of FIG. 3B according to an embodiment of the present disclosure. In particular, shown in FIG. 4 are details of an exemplary implementation of the biasing circuit, $SW_{BIAS}$, operable from the high-voltage supply, $V_{HV}$. As shown in FIG. 4, the biasing circuit, $SW_{BIAS}$, comprises a high-voltage (HV, N-type FET) transistor, $M_3$, having a common source (i.e., connected/coupled to ground), a drain coupled to the common biasing node, $N_{BIAS}$, and a gate coupled to the output of the logic gate, $INV_1$. The biasing circuit, $SW_{BIAS}$, further comprises a (pull-up) resistor, $R_B$, coupled between the drain of the transistor, $M_3$, and the high-voltage supply, $V_{HV}$. An optional capacitor, $C_3$, may be coupled between the common source node, S, and the common biasing node, $N_{BIAS}$, that is configured to filter any noise generated during operation of $SW_1$ and maintain a stable voltage from $N_{BIAS}$ to the common source node S. The HV transmission gate, $S_{W1}$, of FIG. 3B may be suited for transmitting of static or switching signals with any voltage level that is at least one threshold voltage (e.g., of transistors $M_1$, $M_2$) below the level of the high-voltage supply, $V_{HV}$, but not too much below $V_{HV}$ such that it will compromise the maximum allowed gate-to-source voltages of $M_1$ and $M_2$.

With continued reference to FIG. 4, by controlling the logic gate, $INV_1$, a voltage at the common biasing node, $N_{BIAS}$, may be (selectively) pulled up to a level of the high-voltage supply, $V_{HV}$, thereby turning ON transistors $M_1$ and $M_2$. For example, when the gate of the transistor, $M_3$, is high (e.g., control signal $En_1$ is low), the transistor, $M_3$, conducts a current that generates a voltage drop across the (pull-up) resistor, $R_B$, such that the voltage at the common biasing node, $N_{BIAS}$, has a level that is sufficiently low to turn OFF transistors $M_1$ and $M_2$. On the other hand, when the gate of the transistor, $M_3$, is low (e.g., control signal $En_1$ is high), the transistor, $M_3$, does not conduct any current and therefore the voltage at the common biasing node, $N_{BIAS}$, has a level that is substantially equal to the high-voltage supply, $V_{HV}$, which is sufficiently high to turn ON transistors $M_1$ and $M_2$. It should be noted that pull-up devices other than the resistor, $R_B$, may be used, including, for example, a (HV) current source that is configured to operate at voltage levels corresponding to a level of the high-voltage supply, $V_{HV}$. It should be noted that the logic gate, $INV_1$, may be a simple inverter as shown in the various figures of the present disclosure, or any other logic gate (or combination of logic gates) operable from the low-voltage supply, $V_{DD}$, and configured to output complementary LV signals for ON/OFF control of the HV transmission gate, $SW_1$.

Figure 5A:
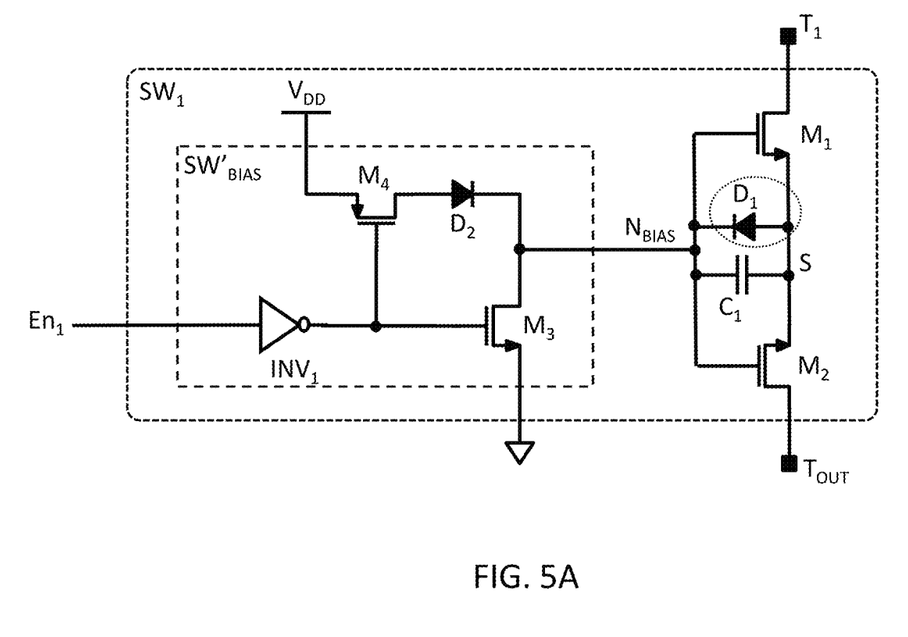
FIG. 5A shows a simplified schematic of the HV transmission gate of FIG. 3C according to an embodiment of the present disclosure.

FIG. 5A shows a simplified schematic of the HV transmission gate, $SW_1$, of FIG. 3C according to an embodiment of the present disclosure. In particular, shown in FIG. 5A are details of an exemplary implementation of the biasing circuit, $SW'_{BIAS}$, operable from the low-voltage supply, $V_{DD}$. As shown in FIG. 5A, the biasing circuit, $SW'_{BIAS}$, comprises a high-voltage (HV, N-type FET) transistor, $M_3$, having a common source (i.e., connected/coupled to ground), a drain coupled to the common biasing node, $N_{BIAS}$, and a gate coupled to the output of the logic gate, $INV_1$. The biasing circuit, $SW'_{BIAS}$, further comprises a low-voltage (LV, P-type FET) transistor, $M_4$, having a source coupled to the low-voltage supply, $V_{DD}$, a drain coupled to the common biasing node, $N_{BIAS}$, via a diode, $D_2$, and a gate coupled to the gate of the transistor, $M_3$. In particular, as shown in FIG. 5A, the anode of the diode, $D_2$, is connected (directly coupled) to the drain of the transistor, $M_4$, and the cathode of the diode, $D_2$, is connected to the drain of the transistor, $M_3$, and therefore to the common biasing node, $N_{BIAS}$.

With continued reference to FIG. 5A, the HV transmission gate, $SW_1$, may be deactivated by logic gate, $INV_1$. For example, when the control signal, $En_1$, is low, the gate of the transistors $M_3$ and $M_4$ are high, the transistor, $M_3$, is turned ON and the transistor, $M_4$, is turned OFF. In this case, the common biasing node, $N_{BIAS}$, (and therefore the common biasing voltage) discharges to a level that is (substantially) equal to zero volts, thereby turning OFF transistors $M_1$ and $M_2$. Accordingly, the capacitor $C_1$ and the common source node, S, discharge to zero volts.

With further reference to FIG. 5A, the HV transmission gate, $SW_1$, may be activated by logic gate, $INV_1$. For example, when the control signal, $En_1$, is high, the gate of the transistors $M_3$ and $M_4$ are low, the transistor, $M_3$, is turned OFF and the transistor, $M_4$, is turned ON. In this case, the common biasing node, $N_{BIAS}$, (and therefore the common biasing voltage) charges up to an initial voltage level that is (approximately) one diode-drop (i.e., $D_2$) below a voltage level of the low-voltage supply, $V_{DD}$, thereby (initially) turning ON transistors $M_1$ and $M_2$. Accordingly, the capacitor $C_1$ charges to the same voltage at the common biasing node, $N_{BIAS}$. It is noted that in this case no current can flow in the reverse direction of the diode, $D_2$, nor through the turned OFF transistor $M_3$. As the voltage at the common source node, S, increases with a voltage level of a signal being transmitted through the HV transmission gate, $SW_1$, the capacitor $C_1$ charges the common biasing node, $N_{BIAS}$, so to maintain the ON states of the transistors $M_1$ and $M_2$. In other words, the combination of the diode, $D_2$, and the capacitor, $C_1$, allows the initial voltage level at the common biasing node, $N_{BIAS}$, to be maintained between the respective gate and sources of the transistors $M_1$ and $M_2$, while transmitting high voltage signals through the HV transmission gate, $SW_1$, or in other words, while voltages at the terminals $T_1$, $T_{OUT}$, and at the common source node, S, vary up to high voltages. Furthermore, it is noted that the diode $D_2$ and the HV transistor $M_3$ may protect the LV transistor $M_4$ and the logic gate, $INV_1$ from high voltages that may be present at the common biasing node, $N_{BIAS}$.

Figure 5B:
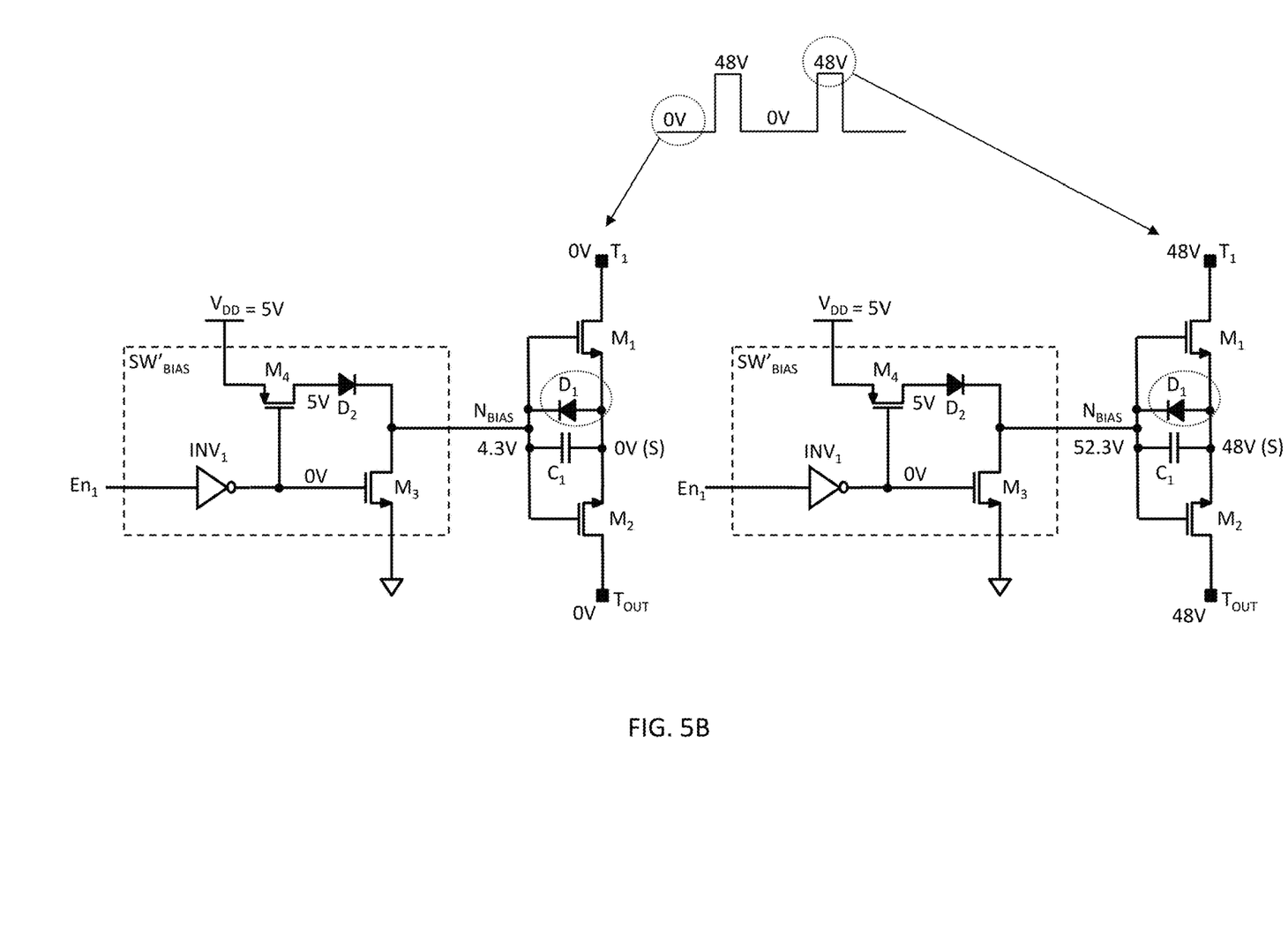
FIG. 5B show exemplary signal levels during operation of the HV transmission gate of FIG. 5A.

Exemplary voltages during an activated state of the HV transmission gate, $SW_1$, of FIG. 5A are shown in FIG. 5B for a case of a switching HV signal of 0 volts (shown on the left side of FIG. 5B) to 48 volts (shown on the right side of FIG. 5B) provided at the first terminal, $T_1$, a low-voltage supply, $V_{DD}$, of 5 volts, and a diode-drop voltage for the diode $D_2$ of 0.7 volts. As shown in FIG. 5B, a voltage difference between the common biasing node, $N_{BIAS}$, and the common source node, S, is maintained (e.g., +4.3 volts) irrespective of a voltage level (e.g., 0 or 48 volts) at the first terminal, $T_1$. It should be noted that the high voltage level of 48 volts used in FIG. 5B is purely exemplary and therefore should not be considered as limiting the scope of the present teachings. In particular, such high voltage level of the switching HV signal may be in a range from 6 volts to 100 volts or higher, including in a range from 20 volts to 100 volts or higher.

Figure 5C:
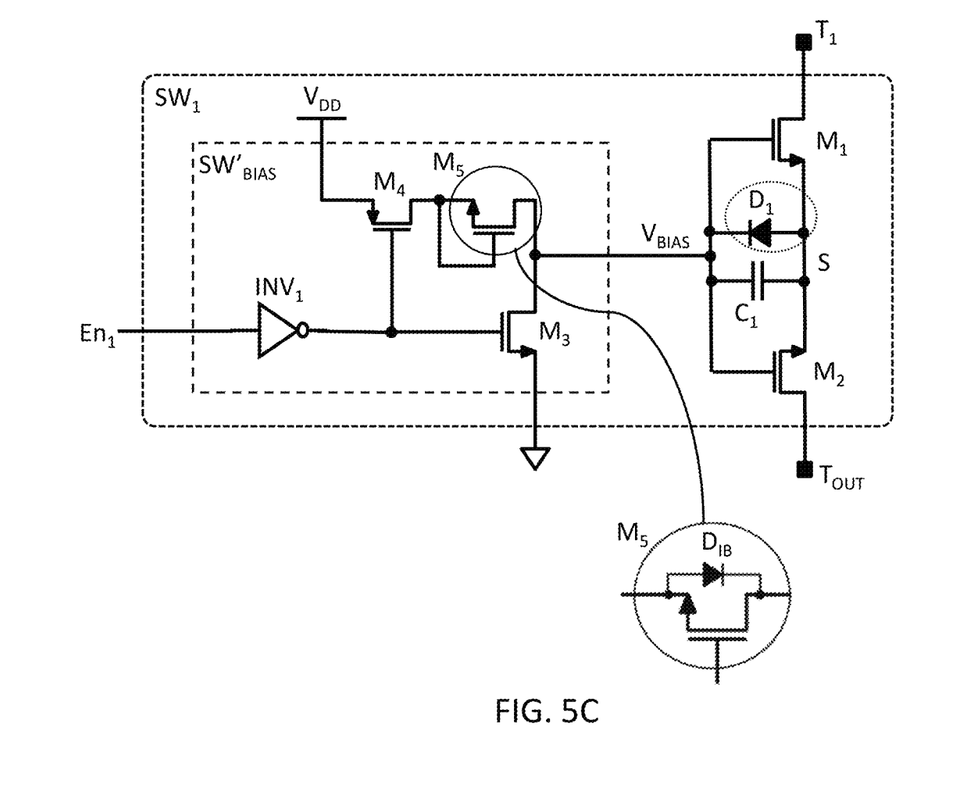
FIG. 5C shows a simplified schematic of the HV transmission gate of FIG. 3C according to another embodiment of the present disclosure.

FIG. 5C shows a simplified schematic of the HV transmission gate, $SW_1$, of FIG. 3C according to another embodiment of the present disclosure. In particular, in the biasing circuit, $SW'_{BIAS}$, shown in FIG. 5C, a diode-connected high-voltage (N-type FET) transistor, $M_5$, is used to provide the functionality of the diode, $D_2$, described above with reference to the biasing circuit, $SW'_{BIAS}$, of FIG. 5A, while maintaining all other functional aspects of the configuration of FIG. 5A. In particular, as shown in FIG. 5C, the HV transistor, $M_5$, has a drain that is connected to the common biasing node, $N_{BIAS}$, a source that is connected to the drain of the LV transistor, $M_4$, and a gate that is connected to its source. Accordingly, the HV transistor, $M_5$, whose gate is shorted to its source, acts as a diode (e.g., diode $D_2$ of FIG. 5A) either through the (intrinsic) body diode (e.g., $D_{IB}$ shown in FIG. 5C) of the transistor, $M_5$, or by operating as a FET diode in reverse direction (i.e., source of $M_5$ as shown in FIG. 5C functions as a drain and drain of $M_5$ as shown on FIG. 5C functions as a source).

Figure 5D:
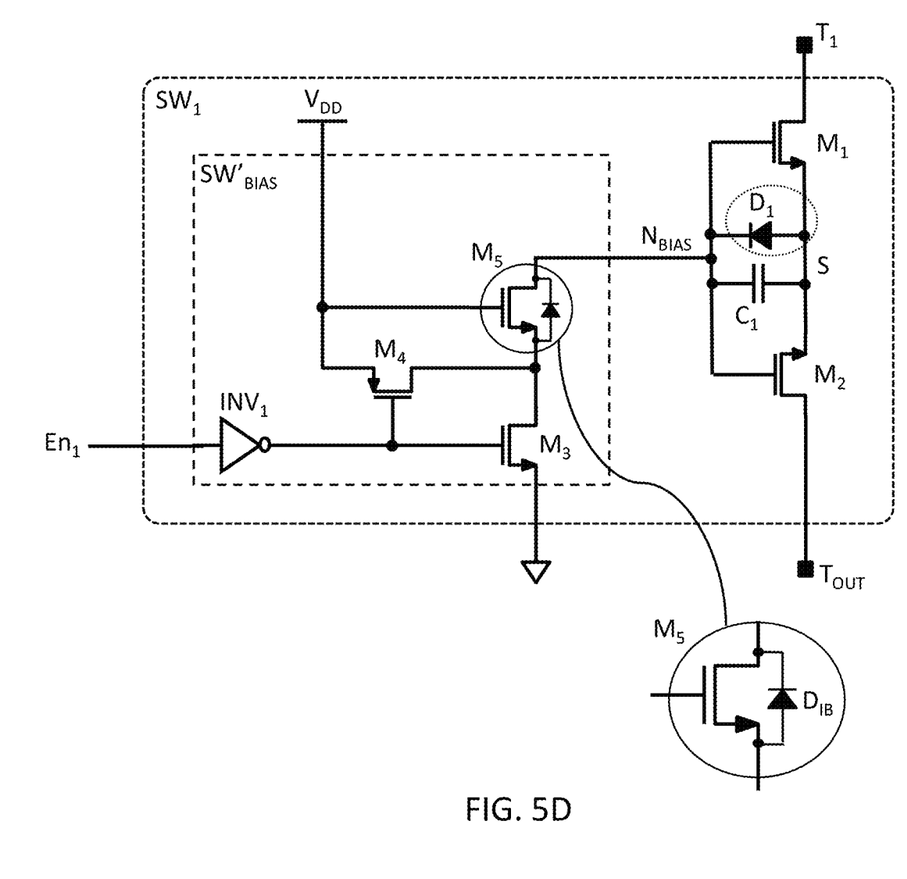
FIG. 5D shows a simplified schematic of the HV transmission gate of FIG. 3C according to yet another embodiment of the present disclosure.

FIG. 5D shows a simplified schematic of the HV transmission gate, $SW_1$, of FIG. 3C according to yet another embodiment of the present disclosure. In particular, shown in FIG. 5D are details of an exemplary implementation of the biasing circuit, $SW'_{BIAS}$, operable from the low-voltage supply, $V_{DD}$. As shown in FIG. 5D, the biasing circuit, $SW'_{BIAS}$, comprises a low-voltage (LV, N-type FET) transistor, $M_3$, having a common source (i.e., connected/coupled to ground), a drain connected to a source of a high-voltage (HV, N-type FET) transistor, $M_5$, and a gate connected to the output of the logic gate, $INV_1$. The transistor, $M_5$, further includes a drain connected to the common biasing node, $N_{BIAS}$, and a gate coupled to the low-voltage supply, $V_{DD}$. The biasing circuit, $SW'_{BIAS}$, further comprises another low-voltage (LV, P-type FET) transistor, $M_4$, having a source coupled to the low-voltage supply, $V_{DD}$, a drain connected to the source of the HV transistor, $M_5$, and a gate connected to the output of the logic gate, $INV_1$.

With continued reference to FIG. 5D, the HV transmission gate, $SW_1$, may be deactivated under control of the logic gate, $INV_1$. For example, when the control signal, $En_1$, is low, the gate of the transistors $M_3$ and $M_4$ are high, the transistor, $M_3$, is turned ON and the transistor, $M_4$, is turned OFF. Accordingly, the source of the transistor, $M_5$, is pulled down (e.g., to ground through $M_3$) while its gate is high, causing the transistor, $M_5$, to turn ON. In this case, the common biasing node, $N_{BIAS}$, (and therefore the common biasing voltage) discharges to a level that is (substantially) equal to zero volts, thereby turning OFF transistors $M_1$ and $M_2$. Accordingly, the capacitor $C_1$ and the common source node, S, discharge to zero volts.

With further reference to FIG. 5D, the HV transmission gate, $SW_1$, may be activated under control of the logic gate, $INV_1$. For example, when the control signal, $En_1$, is high, the gate of the transistors $M_3$ and $M_4$ are low, the transistor, $M_3$, is turned OFF and the transistor, $M_4$, is turned ON. Accordingly, the source of the transistor, $M_5$, sees a voltage that is close to, or substantially equal to, the voltage level of the low-voltage supply, $V_{DD}$. In this case, the common biasing node, $N_{BIAS}$, (and therefore the common biasing voltage) charges up to an initial voltage level through the intrinsic body diode, $D_{IB}$, of the transistor, $M_5$, that is (approximately) one diode-drop (i.e., $D_{IB}$) below a voltage level of the low-voltage supply, $V_{DD}$, thereby (initially) turning ON transistors $M_1$ and $M_2$. Accordingly, the capacitor $C_1$ charges to the same voltage at the common biasing node, $N_{BIAS}$ In a manner similar to the configuration described above with reference to FIG. 5A, as the voltage at the common source node, S, increases with a voltage level of a signal being transmitted through the HV transmission gate, $SW_1$, the capacitor $C_1$ charges the common biasing node, $N_{BIAS}$, so to maintain the ON states of the transistors $M_1$ and $M_2$. In other words, the combination of the diode, $D_{IB}$, and the capacitor, $C_1$, allows the initial voltage level at the common biasing node, $N_{BIAS}$, to be maintained between the respective gate and sources of the transistors $M_1$ and $M_2$, while transmitting high voltage signals through the HV transmission gate, $SW_1$ (while voltages at the terminals $T_1$, $T_{OUT}$, and at the common source node, S, vary up to high voltages). Furthermore, it is noted that the HV transistor, $M_5$, including its intrinsic body diode $D_{IB}$, may protect the LV transistors, $M_3$ and $M_4$, and the logic gate, $INV_1$, from high voltages that may be present at the common biasing node, $N_{BIAS}$.

A person skilled in the art will clearly understand parallels between operation of the HV transmission gate, $SW_1$, described above with reference to FIG. 5A, FIG. 5C and FIG. 5D, wherein activation of the HV transmission gate, $SW_1$, may be based on coupling of the low-voltage supply, $V_{DD}$, to the (anode of the) diode (e.g., $D_2$ of FIG. 5A, $D_{IB}$ of FIG. 5C or FIG. 5D), and deactivation of the HV transmission gate, $SW_1$, may be based on decoupling of the low-voltage supply, $V_{DD}$, from the diode. Decoupling of the low-voltage supply, $V_{DD}$, from the diode for deactivation resulting in a voltage at the common biasing node, $N_{BIAS}$, that is lower than a threshold voltage of the transistors $M_1$ and $M_2$ (e.g., about zero volts).

Figure 6:
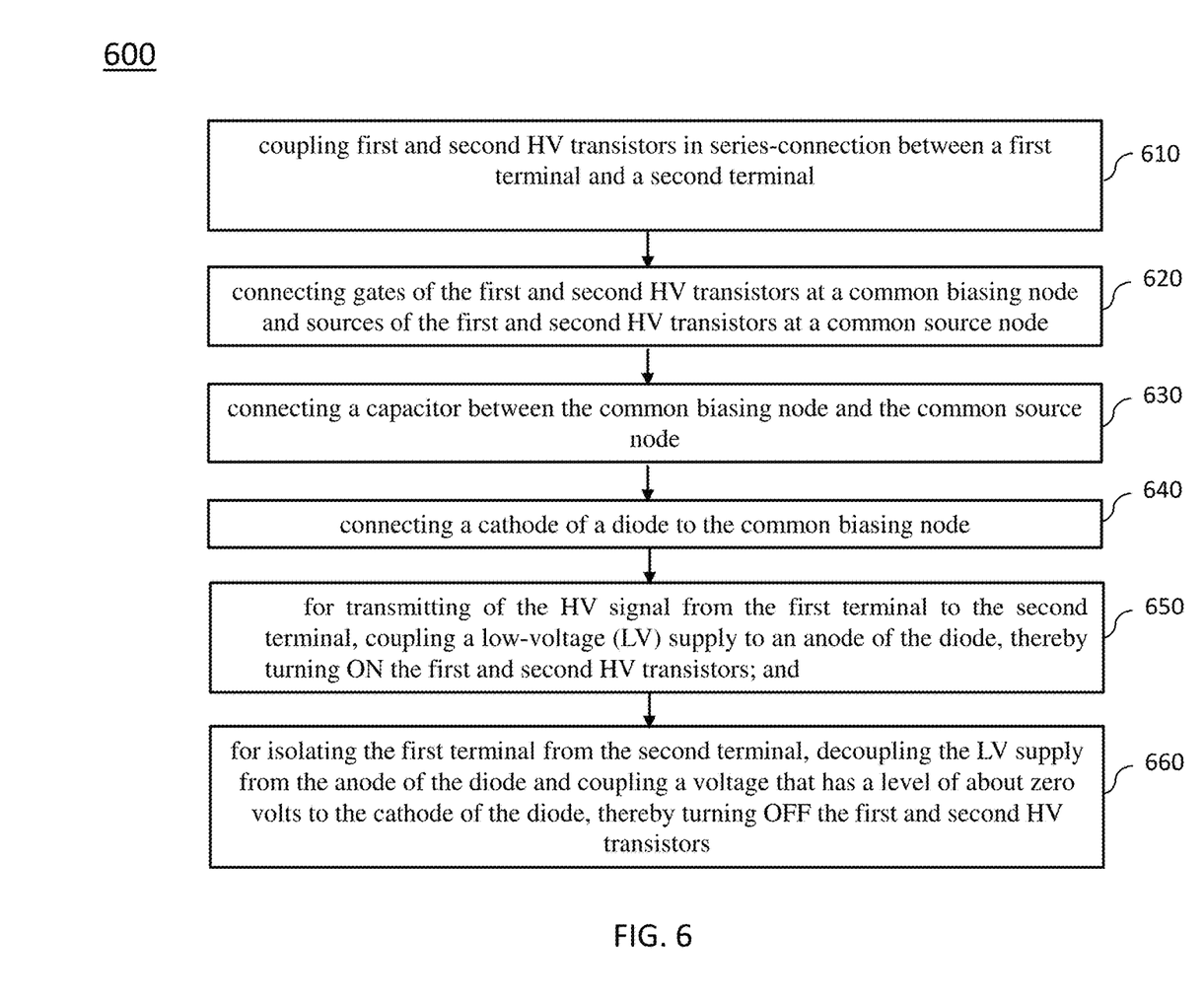
FIG. 6 shows various process steps of a method according to the present disclosure for transmitting a high-voltage (HV) signal between two terminals.

FIG. 6 is a process chart (600) showing various steps of a method according to the present disclosure for transmitting a high-voltage (HV) signal between two terminals. As can be seen in the process chart (600), such steps include: coupling first and second HV transistors in series-connection between a first terminal and a second terminal, per step (610); connecting gates of the first and second HV transistors at a common biasing node and sources of the first and second HV transistors at a common source node, per step (620); connecting a capacitor between the common biasing node and the common source node, per step (630); connecting a cathode of a diode to the common biasing node, per step (640); for transmitting of the HV signal from the first terminal to the second terminal, coupling a low-voltage (LV) supply to an anode of the diode, thereby turning ON the first and second HV transistors, per step (650); and for isolating the first terminal from the second terminal, decoupling the LV supply from the anode of the diode and coupling a voltage that has a level of about zero volts to the cathode of the diode, thereby turning OFF the first and second HV transistors, per step (660).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using BCD HV process, or when fabricated with processes having similar characteristics. Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable various applications including signal, data, and power transmission; power management; wireless communications; data conversions; data processing; and other such applications.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A high-voltage (HV) transmission gate, comprising:
   first and second HV transistors coupled between a first terminal and a second terminal, gates of the first and second HV transistors connected at a common biasing node and sources of the first and second HV transistors connected at a common source node;
   a capacitor connected between the common biasing node and the common source node; and
   a biasing circuit coupled to the common biasing node, the biasing circuit comprising:
      a diode having an anode that is selectively coupled to a low-voltage (LV) supply and a cathode connected to the common biasing node;
      a first LV transistor comprising a source connected to the LV supply and a drain connected to the anode of the diode; and
      a third HV transistor comprising a source connected to a reference ground, and a drain connected to the common biasing node,
   wherein:
      the HV transmission gate comprises an activated state during which the first and second HV transistors are ON, and a deactivated state during which the first and second HV transistors are OFF,
      in the activated state, the first LV transistor in ON, the third HV transistor is OFF, and the anode of the diode is coupled to the LV supply, and
      in the deactivated state, the first LV transistor is OFF, the third HV transistor is ON, and the anode of the diode is decoupled from the LV supply.

2. The HV transmission gate of claim 1, wherein:
   a voltage level of the LV supply is equal to, or greater than, a threshold voltage of the first and second HV transistors.

3. The HV transmission gate of claim 2, wherein:
   the voltage level of the LV supply is smaller than 6 volts.

4. The HV transmission gate of claim 1, wherein:
   the first terminal is provided by a drain of the first HV transistor,
   the second terminal is provided by a drain of the second HV transistor, and
   a signal at the first terminal that is transmitted to the second terminal in the activated state, includes a high voltage level that is in a range from 6 volts to 100 volts or greater.

5. The HV transmission gate of claim 4, wherein:
   the high voltage level is greater than 10 volts.

6. The HV transmission gate of claim 5, wherein:
   the signal at the first terminal is a switching signal that switches from a low voltage level to the high voltage level.

7. The HV transmission gate of claim 1, wherein:
   the diode is provided by a fourth HV transistor comprising a drain connected to the common biasing node, and a source and a gate connected to the drain of the first LV transistor,
   wherein the diode is an intrinsic body diode of the fourth HV transistor.

8. The HV transmission gate of claim 7, wherein:
   the HV transmission gate further comprises a logic gate having an output connected to a gate of the first LV transistor and to a gate of the third HV transistor,
   when the output of the logic gate is low, the first LV transistor is ON and the third HV transistor is OFF, and
   when the output of the logic gate is high, the first LV transistor is OFF and the third HV transistor is ON.

9. The HV transmission gate of claim 8, wherein:
   the output of the logic gate is a LV signal.

10. A high-voltage (HV) transmission gate, comprising:
    first and second HV transistors coupled between a first terminal and a second terminal, gates of the first and second HV transistors connected at a common biasing node and sources of the first and second HV transistors connected at a common source node;
    a capacitor connected between the common biasing node and the common source node; and a biasing circuit coupled to the common biasing node, the biasing circuit comprising:
- a diode having an anode that is selectively coupled to a low-voltage (LV) supply and a cathode connected to the common biasing node;
- a first LV transistor comprising a source connected to the LV supply and a drain connected to the anode of the diode; and
- a second LV transistor comprising a source connected to a reference ground, and a drain connected to the anode of the diode, wherein:
- the HV transmission gate comprises an activated state during which the first and second HV transistors are ON, and a deactivated state during which the first and second HV transistors are OFF,
- in the activated state, the first LV transistor is ON, the second LV transistor is OFF, and the anode of the diode is coupled to the LV supply, and
- in the deactivated state, the first LV transistor is OFF, the second LV transistor is ON, and the anode of the diode is decoupled from the LV supply.

11. The HV transmission gate of claim 10, wherein:
the diode is provided by a fifth HV transistor comprising a drain connected to the common biasing node, a source connected to the drain of the second LV transistor, and a gate coupled to the LV supply,
wherein the diode is an intrinsic body diode of the fifth HV transistor.

12. The HV transmission gate of claim 11, wherein:
the HV transmission gate further comprises a logic gate having an output connected to a gate of the first LV transistor and to a gate of the second LV transistor,
when the output of the logic gate is low, the first LV transistor is ON and the second LV transistor is OFF, and
when the output of the logic gate is high, the first LV transistor is OFF and the second LV transistor is ON.

13. The HV transmission gate of claim 12, wherein:
the output of the logic gate is a LV signal.

14. The HV transmission gate of claim 1, further comprising:
an additional diode having an anode connected to the common source node and a cathode connected to the common biasing node.

15. A high-voltage (HV) multiplexer circuit, comprising:
a plurality of input terminals configured to receive respective plurality of HV signals;
a common output terminal configured to selectively couple to one of the plurality of input terminals for transmitting a respective one of the plurality of HV signals; and
a plurality of HV transmission gates, each HV transmission gate of the plurality of HV transmission gates comprising:
- first and second HV transistors coupled between a first terminal and a second terminal, gates of the first and second HV transistors connected at a common biasing node and sources of the first and second HV transistors connected at a common source node;
- a capacitor connected between the common biasing node and the common source node; and
- a biasing circuit coupled to the common biasing node, the biasing circuit comprising:
  - a diode having an anode that is selectively coupled to a low-voltage (LV) supply and a cathode connected to the common biasing node, wherein:
each HV transmission gate comprises an activated state during which the first and second HV transistors are ON, and a deactivated state during which the first and second HV transistors are OFF,
in the activated state, the anode of the diode is coupled to the LV supply, and
in the deactivated state, the anode of the diode is decoupled from the LV supply, and wherein:
each of the plurality of input terminals is connected to the first terminal of a respective HV transmission gate of the plurality of HV transmission gates, and
the common output terminal is connected to the second terminal of each HV transmission gate of the plurality of HV transmission gates.

16. A power circuit, comprising:
a high-voltage (HV) multiplexer circuit according to the HV multiplexer circuit of claim 15,
wherein:
the HV multiplexer circuit is configured to selectively transmit one of a plurality of HV signals of the power circuit coupled to the plurality of input terminals of the HV multiplexer circuit to the common output terminal of the HV multiplexer circuit.

17. The power circuit of claim 16, wherein:
the power circuit is implemented as an integrated circuit having a plurality of pins, and
the common output terminal of the HV multiplexer circuit is connected to one of the plurality of pins.

18. A high-voltage (HV) transmission gate, comprising:
first and second HV transistors coupled between a first terminal and a second terminal, gates of the first and second HV transistors connected at a common biasing node and sources of the first and second HV transistors connected at a common source node;
a capacitor connected between the common biasing node and the common source node;
a first diode having an anode connected to the common source node and a cathode connected to the common biasing node; and
a biasing circuit coupled to the common biasing node, the biasing circuit comprising:
- a second diode having an anode that is selectively coupled to a low-voltage (LV) supply and a cathode connected to the common biasing node;
- a first LV transistor comprising a source connected to the LV supply and a drain connected to the anode of the diode; and
- a second LV transistor comprising a source connected to a reference ground, and a drain connected to the anode of the second diode, wherein:
the HV transmission gate comprises an activated state during which the first and second HV transistors are ON, and a deactivated state during which the first and second HV transistors are OFF,
in the activated state, the first LV transistor is ON, the second LV transistor is OFF, and the anode of the second diode is coupled to the LV supply, and
in the deactivated state, the first LV transistor is OFF, the second LV transistor is ON, and the anode of the second diode is decoupled from the LV supply.

* * * * *